United States Patent
Moyer et al.

(10) Patent No.: US 8,255,748 B2
(45) Date of Patent: Aug. 28, 2012

(54) SOFT ERROR AND TRANSIENT ERROR DETECTION DEVICE AND METHODS THEREFOR

(75) Inventors: William C. Moyer, Dripping Springs, TX (US); Troy L. Cooper, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 439 days.

(21) Appl. No.: 12/415,338

(22) Filed: Mar. 31, 2009

(65) Prior Publication Data
US 2010/0244918 A1 Sep. 30, 2010

(51) Int. Cl.
*G01R 31/3177* (2006.01)
*G01R 31/40* (2006.01)

(52) U.S. Cl. ........................... 714/724; 714/704
(58) Field of Classification Search .................. None
See application file for complete search history.

(56) References Cited

U.S. PATENT DOCUMENTS

| | | | |
|---|---|---|---|
| 5,471,158 A * | 11/1995 | Mehta | 326/95 |
| 5,717,649 A * | 2/1998 | Kim et al. | 365/230.06 |
| 6,825,691 B1 | 11/2004 | Chu et al. | |
| 6,826,090 B1 | 11/2004 | Chu et al. | |
| 6,882,201 B1 | 4/2005 | Koch, II et al. | |
| 6,930,527 B1 | 8/2005 | Cabanas-Holmen et al. | |
| 7,215,581 B2 | 5/2007 | Lotz et al. | |
| 7,373,572 B2 * | 5/2008 | Mak et al. | 714/729 |
| 7,949,482 B2 * | 5/2011 | Gebara et al. | 702/42 |
| 2005/0091630 A1 * | 4/2005 | Madurawe | 716/16 |
| 2006/0015786 A1 * | 1/2006 | Mitra et al. | 714/724 |
| 2006/0215467 A1 * | 9/2006 | Partsch | 365/194 |
| 2006/0227596 A1 | 10/2006 | Thayer | |

* cited by examiner

*Primary Examiner* — Ajay Bhatia
*Assistant Examiner* — Dipakkumar Gandhi (57) ABSTRACT

A clock signal is received at a clock node of a latch module, and a data signal is received at a data node of the latch module. The data signal including information to be latched at a first latch of the latch module and at a second latch of the latch module. A first representation of the data signal to a first data node of the first latch is delayed relative to a second representation of the data signal to a corresponding first data node of the second latch to obtain a first timing requirement between the data signal and the clock signal relative to the first latch that is substantially different than a second timing requirement. An error signal is generated in response to different data being latched at the first latch than at the second latch.

10 Claims, 6 Drawing Sheets

SOFT ERROR AND TRANSIENT ERROR DETECTION DEVICE AND METHODS THEREFOR

BACKGROUND

1. Field of the Disclosure

The present disclosure relates generally to data processing devices, and more particularly, to error detection at data processing devices.

2. Description of the Related Art

Advancements in the performance and computational capabilities of integrated circuit (IC) data processing devices are often the result of a corresponding reduction in the size of the transistors, conductors, and other components that make up the devices. Furthermore, the operating voltage of modern IC data processing devices is typically minimized to increase the operating frequency and to reduce power dissipation of the devices. Because of these changes, conductors and storage nodes included at the data processing device have correspondingly low capacitance, and therefore are capable of storing only a small amount of energy. Thus, the device is increasingly susceptible to soft errors. A soft error can result from the interaction of an energetic neutron or alpha particle with the small conductors and charge storage nodes of a data processing device. Neutrons typically originate from cosmic rays, and alpha particles originate from materials present in the integrated circuit package and bonding materials.

A combination of the capacitance and the voltage at a node of a device is described by a critical charge parameter, Qcrit, which is the minimum electron charge disturbance needed to change the logic level at the node. Larger Qcrit values are associated with fewer soft errors. Unfortunately, signals at a node with a larger Qcrit value will transition slower and dissipate more power than a node with a relatively smaller Qcrit value. Reduction in the feature size of transistor and conductors at the data processing device and a reduction in the operating voltage decreases Qcrit. Thus, the incidence of soft errors increases as chip technology advances. In a logic circuit, Qcrit is defined as the minimum amount of induced charge required at a circuit node to cause a voltage pulse to propagate from that node to the output of a corresponding logic gate, and be of sufficient duration and magnitude for an error to be subsequently stored at a down-stream latch device. Error correction codes and associated circuitry can be used to detect and sometimes correct soft errors, but is not practical for use at the large number of latches that make up computational logic blocks of a data processing device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

The present disclosure provides a storage element, such as a latch, operable to detect a soft error or error caused by transient interference upstream from the latch, and to provide a signal indicative of the error. The storage element includes multiple latches that receive substantially the same clock signal, such that operation of the storage element is dependent only upon the propagation delay of a single external clock signal. Delays associated with the data paths of the multiple latches are different to facilitate different setup time and hold times at each latch to detect an error event, such as a soft error.

Figure 1:
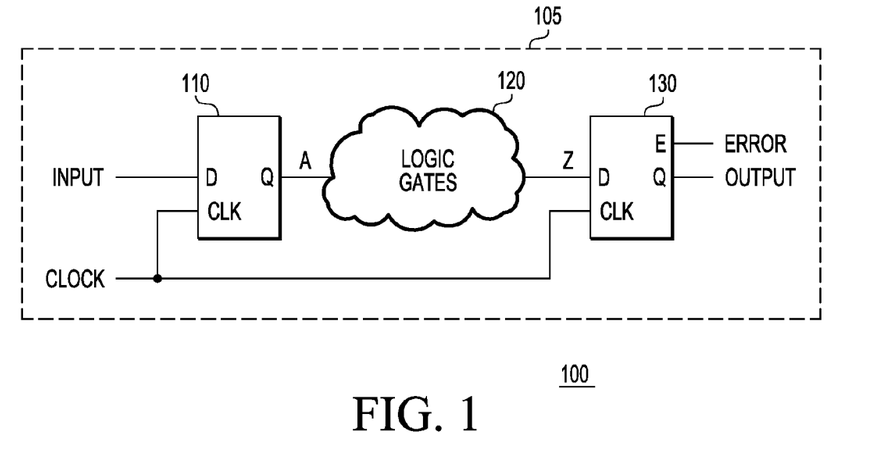
FIG. 1 is a block diagram illustrating a data processing device including a latch capable of detecting a soft error in accordance with a specific embodiment of the present disclosure.

FIG. 1 is a block diagram illustrating a data processing device 100 including a synchronous logic circuit 105 that includes latch 110, logic gates 120, and a storage element, also referred to as error-detecting latch 130. Latch 110 has an input D connected to a node labeled "INPUT," an input CLK connected to a node labeled "CLOCK," and an output Q connected to a node labeled "A." A logic gate 120 has an input connected node A and an output connected to a node labeled "Z." Latch 130 is an error-detecting latch capable of detecting a soft error in accordance with a specific embodiment of the present disclosure. Latch 130 has a data input D connected to node Z, a clock input CLK connected to node CLOCK, a data output Q connected to a node labeled "OUTPUT," and an error detect output E connected to a node labeled "ERROR."

Logic gates 120 represent what is commonly referred to as "a cloud of logic" with one or more data inputs and one or more data outputs. A single data input, connected to node A, and a single data output, connected to node Z, are illustrated for clarity. A logic gate 120 includes logic gates configured to implement a desired logic function. A signal received at an input of logic gates 120, such as from node A, is dispatched in response to a particular transition of clock signal CLOCK, and the data at the outputs of logic gates 120 are latched on the next such clock transition at a latch, such as error-detecting latch 130.

Error-detecting latch 130 is configured to indicate an error in response to storage nodes at error-detecting latch 130 latching different data. For purposes of illustration herein it is assumed that a soft error is being detected. A soft error can occur when a neutron, an alpha particle, or other ionizing radiation interacts with synchronous logic circuit 105 in a manner that causes the logic state of the storage node to be altered. For example, the interaction of such a particle can result in a temporary anomalous transition of a node at logic gates 120 that can propagate downstream through one or more logic gates and can result in an incorrect logic value being stored at a latch device. In either case, the particle or radiation results in a soft error event, and the soft error event has an associated duration. Error-detecting latch 130 includes two or more latches, and data received at a storage node of each latch is latched in response to a common transition of the clock signal at the input of error-detecting latch 130, such as in response to a clock signal transition from a low logic state to a high logic state. The propagation of the data signal from the data input of the error-detecting latch is varied to adjust the setup time and hold time of each latch so that a soft error event with a duration of less than a predetermined period is rejected by at least one of the latches, while the clock signal received at each latch of error detecting latch 130 at substantially the same time. Due to variances in conductors used to propagate signal CLOCK, such as asymmetries in the topology of conductors used to propagate signal CLOCK, a common transition of the clock signal may begin at one latch associated with error detecting latch 130 delayed with respect to when it begins at another latch of error detecting latch 130. The arrival of the clock signal at each respective latch is considered to be substantially the same to the extent these variances are not intended to delay one clock transition from another. In a specific embodiment, the arrival of the clock signal at each respective latch is considered to be substantially the same when they differ by less than ten picoseconds, less than eight picoseconds, less than 6 picoseconds, or less than four picoseconds, and dependent on the process technology in which the device is fabricated, e.g. a forty-five nanometer technology.

Figure 2:
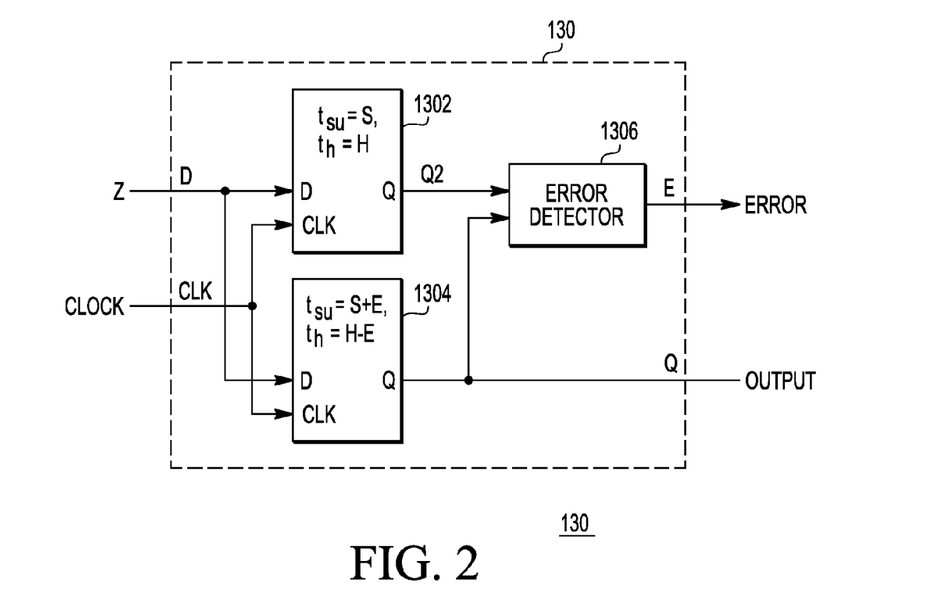
FIG. 2 is a block diagram illustrating an error-detecting latch of FIG. 1 in accordance with a specific embodiment of the present disclosure.

FIG. 2 is a block diagram illustrating an error-detecting latch 130 of FIG. 1 in accordance with a specific embodiment of the present disclosure. Error-detecting latch 130 includes latch 1302, latch 1304, and error detector 1306. Latch 1302 has a data input D connected to input D of error-detecting latch 130, a clock input CLK connect to input CLK of error-detecting latch 130, and an output Q connected to a node labeled "Q2." Latch 1304 has a data input D also connected to node D of error-detecting latch 130, a clock input CLK also connected to node CLK of error-detecting latch 130, and an output Q connected to a node labeled "Q." Error detector 1306 has an input connected to node Q, another input connected to node Q2, and an output connected to node E.

The setup time ($t_{su}$) between the data signal received at input D of error-detecting latch 130 and the clock signal received at input CLK of error-detecting latch 130 relative to latch 1302 is configured to be equal to S picoseconds (pS), and the hold time ($t_h$) is configured to be equal to be H pS. The setup time between the data signal received at input D of error-detecting latch 130 and the clock signal received at input CLK of error-detecting latch 130 relative to latch 1304 is configured to be equal to S+E pS, and the hold time ($t_h$) is configured to be equal to H−E pS, where the value E corresponds to a delay to facilitate detection of a soft error. For example, E can correspond to a portion of the approximate duration of an expected soft error event, or in the case of a soft error event propagated by logic gates, a portion of the increase in the effective propagation delay of a logic path due to an error event at a node associated with the logic path. The value of E can be selected to correspond to a soft error event with a specific maximum duration. The latching of data at latch 1302 and latch 1304 is initiated at the same time by clock signal CLOCK received at node CLK. The operation of error-detecting latch 130 is described in detail with regard to FIGS. 4-6.

Figure 3:
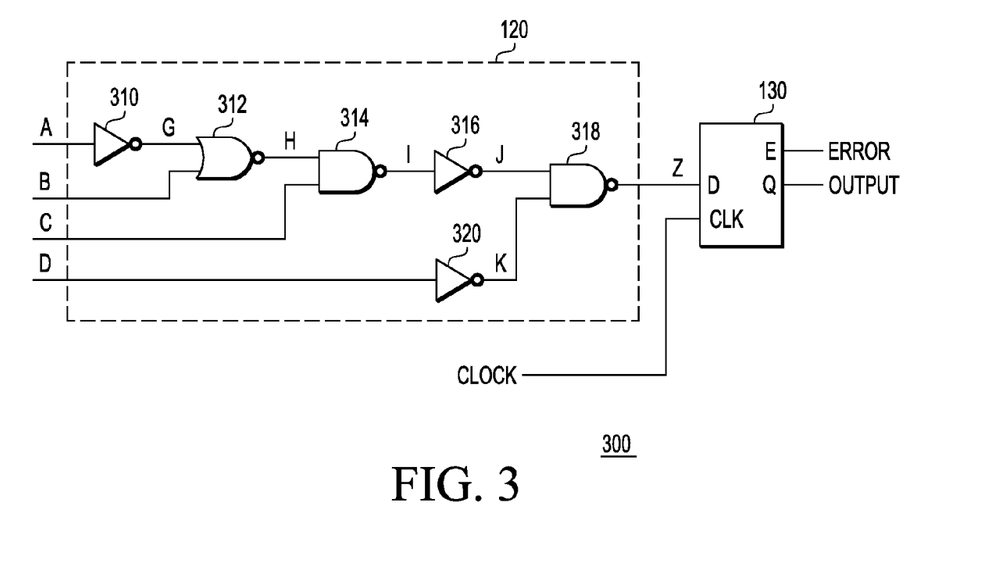
FIG. 3 is a schematic diagram illustrating logic gates and the error-detecting latch of FIG. 1 in accordance with a specific embodiment of the present disclosure.

FIG. 3 is a schematic diagram illustrating logic gates 120 and error-detecting latch 130 of FIG. 1 in accordance with a specific embodiment of the present disclosure. A logic gate 120 includes inverter 310, NOR gate 312, NAND gate 314, inverter 316, NAND gate 318, and inverter 320, which are referred to collectively as logic gates 310-320. Inverter 310 has an input connected to node A and an output connected to node labeled "G." NOR gate 312 has an input connected to node G, an input connected to a node labeled "B," and an output connected to a node labeled "H." NAND gate 314 has an input connected to node H, an input connected to a node labeled "C," and an output connected to a node labeled "I." Inverter 316 has an input connected to node I, and an output connected to a node labeled "K." NAND gate 318 has an input connected to node J, an input connected to a node labeled "K," and an output connected to node Z. Inverter 320 has an input connected to a node labeled "D," and an output connected to node K. Error-detecting latch 130 has a data input connected to node Z, a clock input connected to node CLOCK, an error detect output connected to node ERROR, and a data output connected to node OUTPUT.

Logic gates 310-320 represent a generalized configuration of combinatorial logic gates that may precede a latch at a synchronous logic circuit. A signal received at node A can propagate downstream to nodes G, H, I, J, and Z when the logic path is enabled by appropriate logic values at nodes B, C, and D. Each respective logic gate has a corresponding propagation delay based predominately on the size of transistors included at that gate, and on the capacitance associated with the output node that the gate controls. In order for the synchronous logic circuit to function correctly, information must propagate to node Z before the information is latched at error-detecting latch 130. Specifically, data provided from node Z to input D must be valid for a period of time equal to or greater than the setup time of error-detecting latch 130. In this particular example, the setup time is specified relative to the rising transition of clock signal CLOCK an input CLK.

Error-detecting latch 130 is configured to store information received at input D in response to clock signal CLOCK, and to provide signal ERROR when a soft error results in invalid information stored at one of the latches included at error-detecting latch 130. It is statistically unlikely for a soft error event to be of sufficient duration, or for two independent soft errors to occur during the same clock cycle, so that both latches included at error-detecting latch 130 stores the invalid information.

Figure 4:
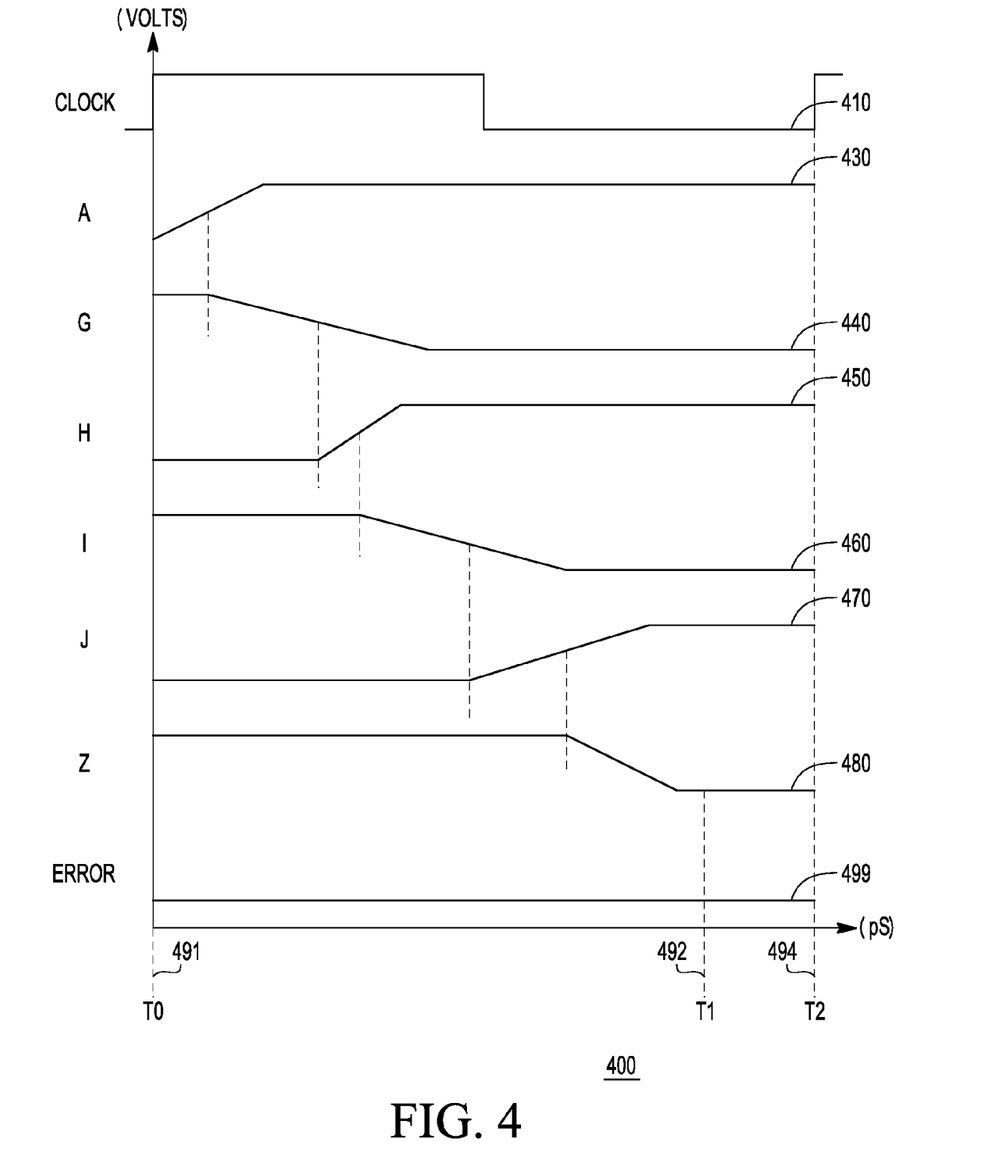
FIG. 4 is a timing diagram illustrating the operation of a synchronous logic circuit of FIG. 1 in accordance with a specific embodiment of the present disclosure.

FIG. 4 is a timing diagram 400 illustrating the operation of synchronous logic circuit 105 of FIG. 1 in accordance with a specific embodiment of the present disclosure. Timing diagram 400 includes a horizontal axis representing time in picoseconds (pS), and a vertical axis representing voltage in volts. Timing diagram 400 includes waveforms 410, 430, 440, 450, 460, 470, 480, and 499 representing signals at nodes associated with logic gates 120 at FIG. 3. Waveform 410 corresponds to clock signal CLOCK at node CLOCK. Waveform 430 represents a signal at node A, waveform 440 represents a signal at node G, waveform 450 represents a signal at node H, waveform 460 represents a signal at node I, waveform 470 represents a signal at node J, waveform 480 represents a signal at node Z, and waveform 499 represents a signal at node ERROR. Also illustrated are time reference T1 492 and time reference T2 494.

Timing diagram 400 illustrates the operation of synchronous logic circuit 105 in the absence of a soft error event. In response to a rising transition of clock signal CLOCK, latch 110 at FIG. 1 begins to drive node A to a logic-high level. Once node A reaches a suitable level, inverter 310 begins to drive node G to a logic-low level. Information continues to propagate downstream successively to nodes H, I, J, and ultimately node Z, which is driven to a logic-low level just prior to time reference T1. Time reference T1 492 and time reference T2 494 represent the setup times of the two latches included at error-detecting latch 130, respectively. In the absence of a soft error event, valid information (a logic-low value) is successfully stored at both latches. Thus, signal ERROR is not asserted by error-detecting latch 130, and waveform 499 remains at a logic-low level.

Figure 5:
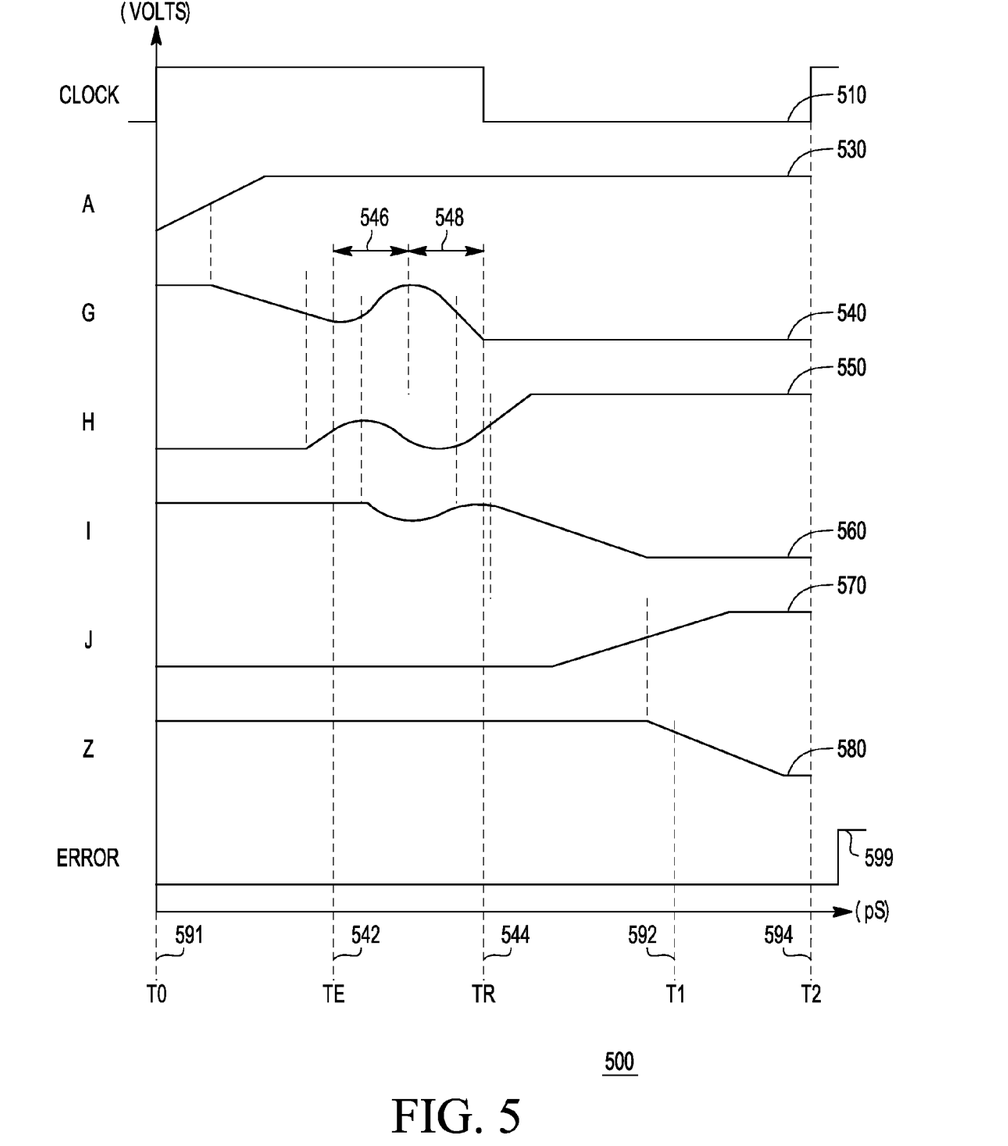
FIG. 5 is a timing diagram illustrating the operation of the synchronous logic circuit of FIG. 1 in response to a soft error event in accordance with a specific embodiment of the present disclosure.

FIG. 5 is a timing diagram 500 illustrating the operation of synchronous logic circuit 105 of FIG. 1 in response to a soft error event in accordance with a specific embodiment of the present disclosure. Timing diagram 500 includes a horizontal axis representing time in picoseconds (pS), and a vertical axis representing voltage in volts. Timing diagram 500 includes waveform 510, 530, 540, 550, 560, 570, 580, and 599 representing signals at nodes associated with logic gates 120 at FIG. 3. Waveform 510 corresponds to clock signal CLOCK at node CLOCK. Waveform 530 represents a signal at node A, waveform 540 represents a signal at node G, waveform 550 represents a signal at node H, waveform 560 represents a signal at node I, waveform 570 represents a signal at node J, waveform 580 represents a signal at node Z, and waveform 599 represents a signal at node ERROR. Also illustrated is time reference T1 592, time reference T2 594, time reference TE 542, time reference TR 544, interval 546, and interval 548.

In response to a rising transition of clock signal CLOCK at T0, latch 110 at FIG. 1 begins to drive node A to a logic-high level. Once node A reaches a suitable level, inverter 310 begins to drive node G to a logic-low level. At approximately time reference TE, a soft error occurs at node G. The soft error has a duration that is approximately equal to interval 544, during which time spurious charge is applied to node G causing the voltage at node G to rise to a logic-high level, for example. It will be appreciated that a soft error need not fully discharge or charge a node to an anomalous level for the soft error to result in invalid information being stored at a downstream latch. Merely delaying the propagation of valid information can cause an error at synchronous logic circuit 105 to occur. During interval 546, inverter 310 continues to drive node G low, which recovers to the logic-low level at time reference TR 544.

NOR gate 312 responds to the anomalous signal at its input connected to node G, which is reflected at its output at node H, and to a lesser extent at node I. The affect of the soft error event is not immediately evident by the shape of waveform 570, node J, or waveform 580, node Z, but a final signal transition at these nodes is delayed relative to waveforms 470 and 480, respectively, at FIG. 4, as a result of the soft error event. Furthermore, signal 580 is at a logic-high level at time reference T1 592, and at a logic-low level at time reference T2 594. Thus, the two latches included at error-detecting latch 130 contain conflicting information, resulting in the assertion of signal ERROR at error-detecting latch 130, as illustrated by waveform 599. Timing diagram 500 illustrates a soft error event associated with node G. It will be appreciated that error detecting latch 130 is operable to detect a soft error event at any node associated with logic cloud 120, such as nodes A, B, C, D, G, H, I, J, K, and Z.

Figure 6:
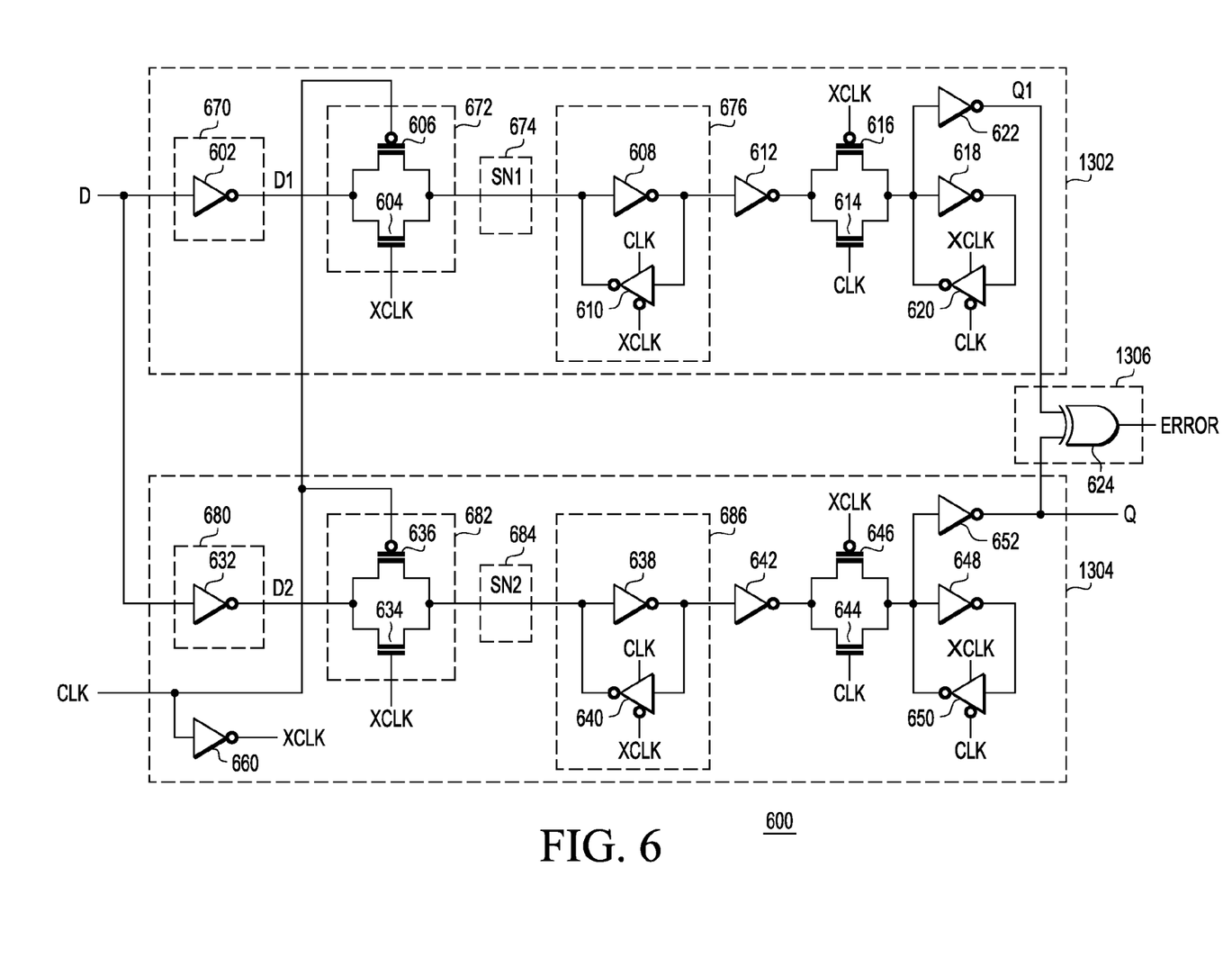
FIG. 6 is a schematic diagram illustrating an error-detecting latch, such as the error-detecting latch of FIG. 1 in accordance with a specific embodiment of the present disclosure.

FIG. 6 is a schematic diagram illustrating an error-detecting latch 600, such as error-detecting latch 130 of FIG. 1, in accordance with a specific embodiment of the present disclosure. Error-detecting latch 600 is a latch module that includes latch 1302, latch 1304, and error detector 1306. Error-detecting latch 600 has a data input connected to node D, a clock input connected to node CLK, a data output connected to node Q, and an error output connected to node ERROR. A data value at data output node Q is determined based upon a state of latch 1304, and an error indicator at error output node ERROR is based upon the state of latch 1304 and a state of latch 1302.

Latch 1302 includes inverters 602, 608, 612, 618, and 622, tri-state inverters 610 and 620, n-channel metal oxide semiconductor (NMOS) field effect transistors 604 and 614, and p-channel metal oxide semiconductor (PMOS) field effect transistors 606 and 616. Inverter 602 has an input connected to input node D to receive a data signal and an output connected to a data node labeled "D1." NMOS transistor 604 has a first current electrode connected to node D1, a control electrode connected to a node labeled "XCLK," and a second current electrode connected to a data node labeled "SN1." PMOS transistor 606 has a first current electrode connected to node D1, a control electrode connected to node CLK, and a second current electrode connected to node SN1. NMOS transistor 604 and PMOS transistor 606 together implement a pass gate. Inverter 608 has an input connected to node SN1 and an output connected to a data node that includes the input of inverter 612 and the input of tri-state inverter 610. Tri-state inverter 610 has active-high drive enable input connected to node CLK, and an active-low drive enable input connected to node XCLK, and an output connected to node SN1.

Inverter 612 has an output connected to a data node that includes first current electrode of NMOS transistor 614 and a first current electrode of PMOS transistor 616. NMOS transistor 614 has a control electrode connected to clock node CLK, and a second current electrode connected to the data node that includes the input of inverter 618 and inverter 622, and the output of tri-state inverter 620. PMOS transistor 616 has a control electrode connected to node XCLK, and a second current electrode connected to the input of inverter 618 and inverter 622, and the output of tri-state inverter 620. Inverter 618 has an output connected to the input of tri-state inverter 620. Tri-state inverter 620 has active-high drive enable input connected to node XCLK, and an active-low drive enable input connected to node CLK. Inverter 622 has an output connected to a node labeled "Q1," and to an input of an exclusive-OR gate 624 of error detector 1306. Inverter 660 has in input connected to node CLK, and an output connected to node XCLK. Exclusive-OR gate 624 has an output connected to node ERROR.

Latch 1304 includes inverters 632, 638, 642, 648, and 652, tri-state inverters 640 and 650, n-channel metal oxide semiconductor (NMOS) field effect transistors 634 and 644, and p-channel metal oxide semiconductor (PMOS) field effect transistors 636 and 646. Inverter 632 has an input connected to input node D to receive a data signal and an output connected to a data node labeled "D2." NMOS transistor 634 has a first current electrode connected to node D2, a control electrode connected to node XCLK, and a second current electrode connected to a data node labeled "SN2." PMOS transistor 636 has a first current electrode connected to node D2, a control electrode connected to node CLK, and a second current electrode connected to node SN2. Inverter 638 has an input connected to node SN2 and an output connected to the input of inverter 642 and to the input of tri-state inverter 640. Tri-state inverter 640 has active-high drive enable input connected to node CLK, and an active-low drive enable input connected to node XCLK, and an output connected to node SN2.

Inverter 642 has an output connected to a data node than includes a first current electrode (source/drain) of NMOS transistor 644 and a first current electrode of PMOS transistor 646. NMOS transistor 644 has a control electrode connected to clock node CLK, and a second current electrode connected to the data node that includes the input of inverter 648 and inverter 652, and the output of tri-state inverter 650. PMOS transistor 646 has a control electrode connected to node XCLK, and a second current electrode connected to the input of inverter 648 and inverter 652, and the output of tri-state inverter 650. Inverter 648 has an output connected to the input of tri-state inverter 650. Tri-state inverter 650 has active-high drive enable input connected to node XCLK, and an active-low drive enable input connected to node CLK. Inverter 652 has an output connected to node Q, and to another input of exclusive-OR gate 624 of error detector 1306.

Latch 1302 is configured to store information received at node D and provide the stored information at node Q1. Latch 1302 is referred to as a master-slave latch, and includes a master latch provided by inverter 608 and tri-state inverter 610, and a slave latch provided by inverter 618 and tri-state inverter 620. The master latch is updated while clock signal CLK is negated. The input of the slave latch is connected to the output of the master latch and is updated while clock signal CLK is asserted.

A data signal received at node D is buffered by inverter 602, and is conducted to storage node SN1 by NMOS transistor 604 and PMOS transistor 606 while clock signal XCLK is asserted. The output of tri-state inverter 610 is maintained at a high-impedance state while clock signal XCLK is asserted. When clock signal XCLK is negated (and clock signal CLK is asserted), storage node SN1 is isolated from the output of inverter 602, and the output of tri-state inverter 610 is enabled to drive storage node SN1. Also in response to the assertion of clock signal CLK, the slave latch is updated and the stored information is provided at node Q1.

The operation of latch 1304 is the same as described with reference to latch 1302. Node Q at the output of latch 1304 is the primary data output of error-detecting latch 130. Exclusive-OR gate 624 compares the information stored at latch 1302 and latch 1304, and asserts signal ERROR if the value stored at each of the two latches is not the same, such as described with reference to the timing diagram of FIG. 5. The setup time and hold time of the master portion of latch 1302 is configured to be different than corresponding timing requirements of the master portion of latch 1304, as described with reference to FIG. 2. For example, in an embodiment, the setup time associated with latch 1304 can be configured to be greater than the setup time associated with latch 1302 by an amount greater than approximately one half of the duration of an anticipated soft error event, such as approximately one-half of a soft error event.

The timing requirements, such as the setup time and hold times in particular, of the master latches of error-detecting latch 1302 can be set by a combination of circuit attributes that affect the delay of data along the data paths that include the master latches. For example attributes associated with respective portions 670, 672, 674 and 676 of latch 1302, and portions 680, 682, 684, and 686 of latch 1304. Portion 670 includes inverter 602, portion 672 include NMOS transistor 604 and PMOS transistor 606, portion 674 includes storage node SN1, and portion 676 includes inverter 608 and tri-state inverter 610. Portion 680 includes inverter 632, portion 682 include NMOS transistor 634 and PMOS transistor 636, portion 684 includes storage node SN2, and portion 686 includes inverter 638 and tri-state inverter 640. The setup time and hold time associated with the master latches can be configured by adding delay elements, adjusting the widths and lengths of individual transistors, adjusting the threshold voltage of these transistors, and adjusting the capacitance at nodes associated with these transistors.

The setup time and hold time of a latch are examples of timing requirements that relate the transition of a data signal received at the input D of the latch 600 to a transition of clock signal at input CLK. A setup timing requirement specifies a minimum time that a data signal must be at a valid level prior to an active transition of signal CLK. A hold timing requirement specifies a minimum time that a data signal must remain at the valid level following the active transition of signal CLK. Setup and hold times can be positive or negative values. The setup and hold times of latch 1302 (e.g., the timing require-ment between the data signal at input D and the clock signal at input CLK for latch 1302) and latch 1304 (e.g., the timing requirement between the data signal at input D and the clock signal at input CLK for latch 1304) are configured to be substantially different. For example, the data signal along the data path of latch 1302 can be adjusted, relative to the data signal along the data path of latch 1304, by an amount that is greater than an expected variation between the clock paths of latch 1302 and 1304. For example, the delay of a data signal can be greater than sixteen picoseconds. In contrast to the master portions of the latches 1302 and 1304, the slave portion of each latch is designed to be substantially similar. For example, inverters 612, 618, 622, NMOS transistor 614, PMOS transistor 616, and tri-state inverter 620 of latch 1302 and their interconnects can be designed to have substantially the same electrical properties as the corresponding devices at latch 1304. Thus, the slave portion of latch 1302 and the slave portion of latch 1304 have substantially the same timing characteristics, and which are not dependent on external clock propagation delays.

Previous techniques utilized to implement an error-detecting latch require manipulation of the propagation delay of disparate external clock signals provided to the error-detecting latch using complex clock-tree and clock distribution analysis. Additional devices and node capacitance associated with multiple clock signals can increase the amount of power dissipated by the data processing device. The disclosed error-detecting latch 130 receives only one clock signal (signal CLK) and thus eliminates the need to precisely regulate the delay of multiple clock signals. This technique has the additional benefit that the timing characteristics of error detecting latch 130 are not dependent on multiple external clock propagation delays. Thus, the timing properties of error detecting latch 130 can be characterized independent of its instantiations at a device.

Figure 7:
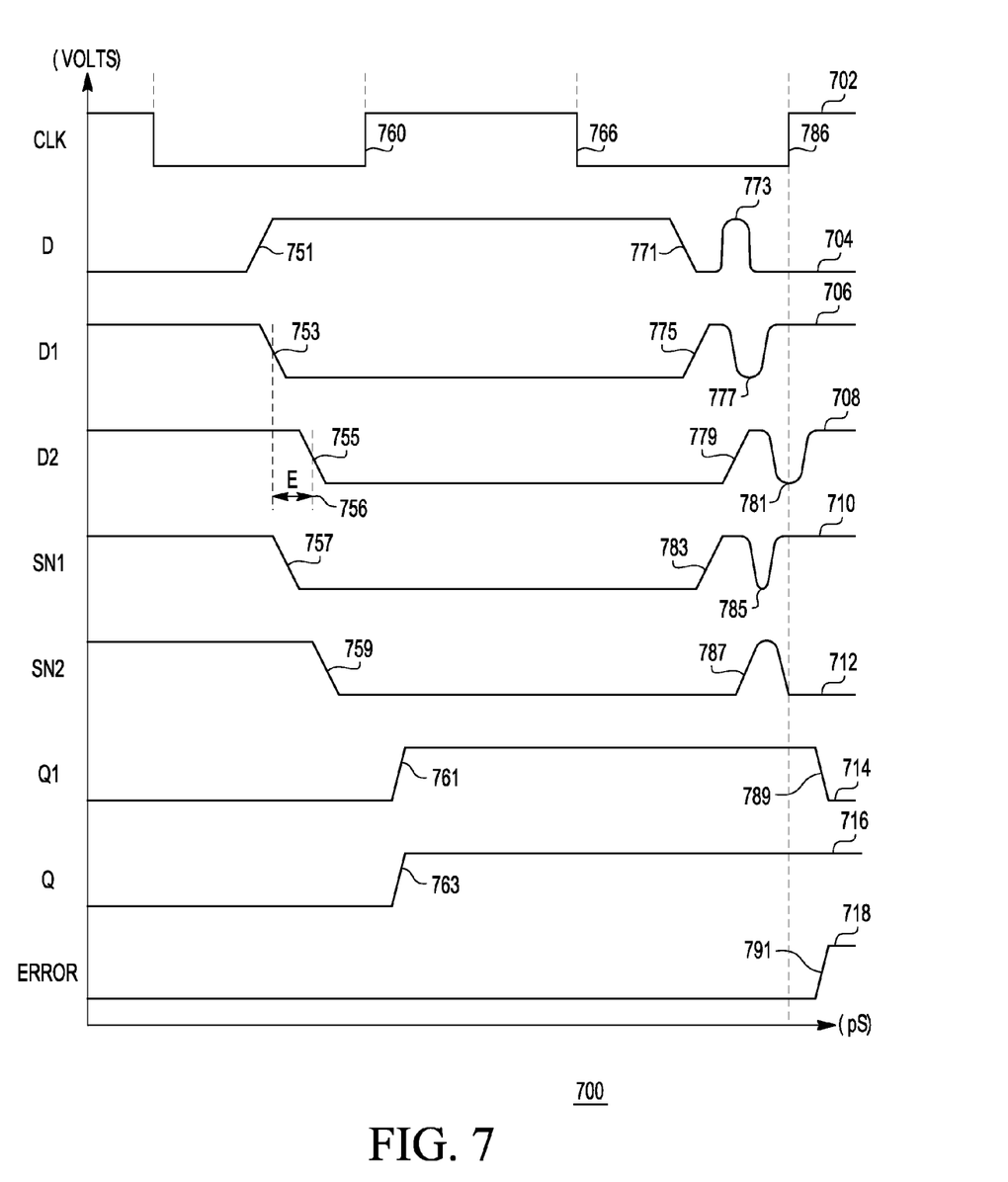
FIG. 7 is a timing diagram illustrating the operation of the error detecting latch of FIG. 6 in accordance with a specific embodiment of the present disclosure.

FIG. 7 is a timing diagram 700 illustrating the operation of error detecting latch 600 of FIG. 6 in accordance with a specific embodiment of the present disclosure. Timing diagram 700 includes a horizontal axis representing time in picoseconds (pS), and a vertical axis representing voltage in volts. Timing diagram 700 includes waveforms 702, 704, 706, 708, 710, 712, 714, 716, and 718 representing signals at nodes associated with devices included at error detecting latch 130 at FIG. 6. Waveform 702 corresponds to a clock signal at input node CLK and includes transition 760, 766, and 786. Waveform 704 represents a signal at input node D and includes transitions 751 and 771 and transient pulse 773. Waveform 706 represents a signal at node D1 based upon the signal at D1, e.g., a representation of the signal at input node D, and includes transitions 753 and 775, and transient pulse 777. Waveform 708 represents a signal at node D2 based on the signal at D, e.g., a representation of the signal at input node D, and includes transitions 755 and 779, interval E 756, and transient pulse 781. Waveform 710 represents a signal at node SN1 and includes transitions 757 and 783, and transient pulse 785. Waveform 712 represents a signal at node SN2 and includes transitions 759 and 787. Waveform 714 represents a signal at node Q1 and includes transitions 761 and 789. Waveform 716 represents a signal at node Q and includes transition 763. Waveform 718 represents a signal at node ERROR and includes transition 791.

The setup time of latch 1302 is configured to be different than the setup time of latch 1304 by configuring the propagation delay of inverter 602 and inverter 632 to differ by a desired amount of time, E 756. For example, inverter 632 can include three inverters connected in series, while inverter 602 can include a single inverter. A low to high transition 751 of data input signal D is received at the input of inverter 602 and inverter 632, resulting in corresponding high to low transitions 753 and 755 at nodes D1 and D2 respectively. The propagation delay of inverter 632 is configured to be greater than the propagation delay of inverter 602 by an amount of time illustrated by an interval labeled "E." At the time that the nodes D1 and D2 transitions low, clock signal CLK is negated so that the pass gate implemented by PMOS transistor 606 and NMOS transistor 604 and the pass gate implemented by PMOS transistor 636 and NMOS transistor 634 are both activated, resulting in transition 757 at node SN1 and transition 759 at node SN2. A subsequent low to high transition 760 at node CLK deactivates both of the pass gates associated with NMOS transistor 604 and NMOS transistor 634 to latch identical logic values at latch 1302 and latch 1304. The low to high transition 760 causes the pass gate implemented by PMOS transistor 616 and NMOS transistor 614 and the pass gate implemented by PMOS transistor 646 and NMOS transistor 644 to be activated, and the information stored at latch 1302 and latch 1304 to be propagated to node Q1 (transition 761) and node Q (transition 763), respectively. Because the same information was successfully latched in latch 1302 and latch 1304, signal ERROR is not asserted.

During the next clock cycle, a high to low transition 771 of data input signal D is received at the input of inverter 602 and inverter 632, resulting in corresponding high to low transitions 775 and 779 at nodes D1 and D2 respectively. At this time, clock signal CLK is negated so that the pass gate implemented by PMOS transistor 606 and NMOS transistor 604 and the pass gate implemented by PMOS transistor 636 and NMOS transistor 634 are both activated, resulting in transition 783 at node SN1 and transition 787 at node SN2. Shortly after transition 771 of data input signal D, a soft error at node D causes transient pulse 773. Transient pulse 773 is propagated through inverter 602 and inverter 632, resulting in transient pulse 777 at node D1 and transient pulse 781 at node D2. The pass gate implemented by PMOS transistor 606 and NMOS transistor 604 is activated at the time the transient pulse occurs at input D, and the signal received at node D1, including its subsequent recovery to a logic-high level, is propagated to node SN1. The logic-high level is successfully stored at the master latch of latch 1302 in response to transition 786 of signal CLK, resulting in a high to low transition 789 at node Q1. However, because the signal provided to nodes D2 and SN2 are delayed with respect to nodes D1 and SN1, the signal at node SN2 is unable to recover to a logic-high level before the pass gate implemented by PMOS transistor 636 and NMOS transistor 634 is deactivated by the signal CLK. Thus, a logic-low level is latched at the master latch of latch 1304, and signal Q remains at a logic-high level. Signal ERROR is asserted to indicate an error condition because latch 1302 and latch 1304 have stored different values.

In an alternate embodiment, the timing requirements of latch 1302 and latch 1304 can be adjusted by manipulating properties associated with other devices along their respective delay paths. For example, increasing the threshold voltage of NMOS transistor 604 and PMOS transistor 606 relative to the threshold voltage of NMOS transistor 634 and PMOS transistor 636 changes the I/V characteristics of these devices and thus modifies the switching characteristics of inverter 608 and 638, respectively, to introduce and effective delay. In another embodiment, the capacitance at storage node SN1 can be increased relative the capacitance at storage node SN2 to increase the propagation delay of data from input D to node SN1 of the data path through latch 1302, and thereby reducing the setup time of the master latch. In yet another embodiment, the switching characteristics of inverter 608 or inverter 638 can be manipulated by adding delay elements, adjusting transistor dimensions, doping levels, or the like, to modify the timing requirements of latch 1302 and latch 1304.

Note that not all of the activities or elements described above in the general description are required, that a portion of a specific activity or device may not be required, and that one or more further activities may be performed, or elements included, in addition to those described. Still further, the order in which the activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. For example, in an embodiment, error-detecting latch 130 can be implemented using standard cells available in an existing standard cell library. Latch 1302 and latch 1304 can be selected from existing master-slave latches based on their timing characteristics and based on the transition time of the corresponding data input signal. Error-detecting latch 600 described at FIG. 6 represents one example of how error-detecting latch 130 can be implemented. Latch 1302 and latch 1304 can be implemented using another type of latch circuit that provides the disclosed timing characteristics. Furthermore, the term latch is used broadly in the disclosure and is applicable to various types of storage elements that store information based upon a clock signal. Types of latches include level-sensitive latch, edge-triggered latch, or flip-flop such as a JK flip-flop or a D flip-flop.

An error detecting latch, such as error detecting latch 130, can include more than two latches, and majority-voting logic can be used to determine the value of data provided at the output of error detecting latch 130 based on respective values stored at each latch. Signal ERROR is asserted if all latches included at error detecting latch 130 have not stored the same value. Furthermore, three latches can be included at error detecting latch 130 and each latch can include different setup and hold times relative to the other latches.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
   a data input to receive a data signal;
   a clock input to receive a clock signal to latch information based on the data signal;
   a first signal path including the data input and a first latch, the first signal path having a first delay between the data input and a first data node for a given transition at the data input; and
   a second signal path including the data input and a second latch, the second signal path including a first data node at a same location relative to the second latch as the first data node of the first signal path is located relative to the first latch, the second signal path having a second delay between the data input and the first node of the second signal path for the given transition, the second delay being substantially different that the first delay;

wherein the first signal path further comprises a first pass gate comprising a first current electrode coupled to receive information from the data input, and a second current electrode coupled to provide the information to the first latch, the first pass gate having a third delay between the first current electrode and the second current electrode for the given signal; and wherein the second signal path further comprises a second pass gate comprising a first current electrode coupled to receive information from the data input, and a second current electrode coupled to provide information to the second latch, the second pass gate having a fourth delay between the first current electrode and the second current electrode for the given signal, the difference between the first delay and the second delay is substantially the same as the difference between the third delay and the fourth delay.

2. The device of claim 1 further comprising a data output coupled to the first latch to provide a latched data value.

3. The device of claim 1 wherein the latched data value is based on the first latch but not the second latch.

4. The device of claim 3 further comprising an error output coupled to the first latch and to the second latch to provide an indicator that the latched data value is to be considered invalid.

5. The device of claim 1 wherein the third delay and the forth delay are determined based on respective electrical characteristics of the first pass gate and the second pass gate.

6. The device of claim 1 wherein timing characteristics of a signal provided at the output of the device is not based on the first delay or the second delay.

7. A method comprising:
receiving a signal transition at a data node of a latch module, the signal transition received at substantially the same time at a first source/drain of a first transistor and at a first source/drain of a second transistor;
providing a first representation of the signal transition to a second source/drain of the first transistor at a first time;
providing a second representation of the signal transition to a second source/drain of the second transistor at a second time;
receiving, at a third time, an initial portion of a clock transition at a gate of the first transistor to latch information at a first storage node of the latch module; and
receiving, at substantially the third time, the initial portion of the clock transition at a gate of the second transistor to latch information at a second storage node of the latch module.

8. The method of claim 7 further comprising indicating an error condition based upon information latched at the first storage node and at the second storage node.

9. The method of claim 7 wherein the first time and the second time are determined based on respective electrical characteristics of the first transistor and the second transistor.

10. The method of claim 7 wherein the first time and the second time are determined based on a respective capacitance at the second source/drain of the first transistor and at the second source/drain of the second transistor.

* * * * *